(12) United States Patent
Lee et al.

(10) Patent No.: US 9,514,884 B2
(45) Date of Patent: Dec. 6, 2016

(54) MULTILAYER CERAMIC ELECTRONIC COMPONENT AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventors: Kyoung No Lee, Suwon-Si (KR); Byung Jun Jeon, Suwon-Si (KR); Eun Me Park, Suwon-Si (KR); Chang Hoon Kim, Suwon-Si (KR); Byong Gyun Kim, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 263 days.

(21) Appl. No.: 14/281,361

(22) Filed: May 19, 2014

(65) Prior Publication Data

US 2015/0136463 A1 May 21, 2015

(51) Int. Cl.
*H01G 4/228* (2006.01)
*H01G 4/30* (2006.01)
(Continued)

(52) U.S. Cl.
CPC ............... *H01G 4/30* (2013.01); *H01G 2/065* (2013.01); *H01G 4/005* (2013.01); *H01G 4/232* (2013.01);
(Continued)

(58) Field of Classification Search
CPC ............ H01C 1/148; H01C 7/18; H01C 7/13; H05K 1/18; H05K 1/181; H05K 1/0231; H05K 1/185; H05K 3/4602; H05K 3/3442; H05K 7/00; H05K 2201/10636; H05K 2201/10674; H01G 2/065; H01G 4/005; H01G 4/06; H01G 4/228; H01G 4/232; H01G 4/2325; H01G 4/30; H01G 4/12; H01G 4/224; H01L 23/645; H01L 21/4857; H01L 24/16; H01L 2924/01005; H01L 2924/01019; H01L 2924/01082; H01L 2924/01025; H01L 2924/01078; H01L 2924/01052; H01L 2924/15312; H01L 2224/08; H01L 41/0471; H01L 41/047; Y02P 70/613; Y02P 70/611; Y10T 29/435
(Continued)

(56) References Cited

U.S. PATENT DOCUMENTS

| 2008/0030922 A1* | 2/2008 | Hidaka | H01G 4/232 |
| | | | 361/303 |
| 2008/0239617 A1* | 10/2008 | Motoki | H01G 4/232 |
| | | | 361/301.4 |

(Continued)

FOREIGN PATENT DOCUMENTS

| JP | 2007-073883 A | 3/2007 |
| JP | 2008-283170 A | 11/2008 |

(Continued)

OTHER PUBLICATIONS

Japanese Office Action dated Sep. 15, 2015 issued in Japanese Patent Application No. 2014-097099 (English translation).

*Primary Examiner* — Timothy Thompson
*Assistant Examiner* — Guillermo Egoavil
(74) *Attorney, Agent, or Firm* — McDermott Will & Emery LLP (57) ABSTRACT

A multilayer ceramic electronic component is provided including a ceramic body having dielectric layers and a plurality of internal electrodes disposed in the ceramic body. The internal electrodes have exposed portions exposed to the exterior of the ceramic body. An electrode layer is disposed (Continued)

on an outer surface of the ceramic body electrically connected to the exposed portions of the internal electrodes A conductive resin layer is disposed on the electrode layer. The electrode layer has an uneven surface.

16 Claims, 4 Drawing Sheets (51) Int. Cl.
| | |
|---|---|
| *H01G 4/005* | (2006.01) |
| *H05K 1/11* | (2006.01) |
| *H05K 1/18* | (2006.01) |
| *H01G 2/06* | (2006.01) |
| *H01G 4/232* | (2006.01) |
| *H01G 4/12* | (2006.01) |
| *H05K 3/34* | (2006.01) |

(52) U.S. Cl.
CPC ............... *H05K 1/111* (2013.01); *H05K 1/181* (2013.01); *H01G 4/12* (2013.01); *H05K 3/3442* (2013.01); *H05K 2201/10015* (2013.01)

(58) Field of Classification Search
USPC ......... 174/260, 256; 310/311, 366; 336/200; 338/22 R, 21; 361/321.2, 301.3, 764, 361/301.4, 306.3, 321.1, 306.1, 305, 311, 361/309, 303
See application file for complete search history.

(56) References Cited

U.S. PATENT DOCUMENTS

| | | | |
|---|---|---|---|
| 2009/0052114 A1* | 2/2009 | Motoki | H01G 4/30 361/306.3 |
| 2011/0255209 A1 | 10/2011 | Ishida et al. | |
| 2011/0292567 A1* | 12/2011 | McConnell | B23K 1/0016 361/321.2 |
| 2012/0075766 A1* | 3/2012 | Nishioka | H01G 4/30 361/301.4 |
| 2012/0161576 A1 | 6/2012 | Motoki et al. | |
| 2012/0236461 A1* | 9/2012 | Yamamoto | H01C 1/14 361/305 |

FOREIGN PATENT DOCUMENTS

| | | |
|---|---|---|
| JP | 2010-232320 A | 10/2010 |
| JP | 2011-228334 A | 11/2011 |
| JP | 2012-134413 A | 7/2012 |
| JP | 2013-073952 A | 4/2013 |
| KR | 1997-0077189 A | 12/1997 |
| KR | 10-0586962 B1 | 5/2006 |

* cited by examiner

MULTILAYER CERAMIC ELECTRONIC COMPONENT AND BOARD HAVING THE SAME MOUNTED THEREON

CROSS-REFERENCE TO RELATED APPLICATION

This application claims the benefit of Korean Patent Application No. 10-2013-0139219 filed on Nov. 15, 2013, with the Korean Intellectual Property Office, the disclosure of which is incorporated herein by reference.

TECHNICAL FIELD

The present disclosure relates to a multilayer ceramic electronic component and a board having the same mounted thereon.

BACKGROUND

Among ceramic electronic components, a multilayer ceramic capacitor includes a plurality of stacked dielectric layers, internal electrodes disposed to face each other, having the dielectric layers interposed therebetween, and external electrodes electrically connected to the internal electrodes.

Multilayer ceramic capacitors have been widely used as components in mobile communications devices such as laptop computers, personal digital assistants (PDAs), mobile phones, and the like, due to advantages thereof such as a small size, high capacitance, ease of mounting, or the like.

Recently, as electronic products are miniaturized and multi-functionalized, chip components also tend to be miniaturized and multi-functionalized. Therefore, a small sized multilayer ceramic capacitor having high capacitance has been demanded.

To this end, multilayer ceramic capacitors having increased numbers of laminated dielectric layers by decreasing thicknesses of the dielectric layers and internal electrode layers have been manufactured, while external electrodes thereof have also been thinned.

In addition, as various functions of devices such as vehicles or medical devices requiring high degrees of reliability have been digitalized and demand for such devices has increased, there has accordingly been demand for multilayer ceramic capacitors having high degrees of reliability.

SUMMARY

An exemplary embodiment in the present disclosure provides a multilayer ceramic electronic component and a board having the same mounted thereon.

According to an exemplary embodiment in the present disclosure, a multilayer ceramic electronic component includes a ceramic body including dielectric layers, and a plurality of internal electrodes disposed in the ceramic body and having exposed portions exposed to the exterior of the ceramic body. An electrode layer is disposed on an outer surface of the ceramic body electrically connected to the exposed portions of the internal electrodes. A conductive resin layer is disposed on the electrode layer. The electrode layer has an uneven surface.

The electrode layer may have an uneven surface including crests and troughs.

The electrode layer may have an uneven surface including crests and troughs, and when a distance between the exposed portions of the internal electrodes is defined as a and a height of the crests of the electrode layer is defined as b, $0.5 \leq b/a \leq 3$ may be satisfied.

The electrode layer may have an uneven surface including crests and troughs, the crests of the electrode layer corresponding to the exposed portions of the internal electrodes, and the troughs of the electrode layer corresponding to points between the exposed portions of the internal electrodes.

The electrode layer may have an uneven surface including crests and troughs, and a height of the crests of the electrode layer may be 0.5 to 3 μm.

According to an exemplary embodiment in the present disclosure, a multilayer ceramic electronic component includes a ceramic body including a plurality of dielectric layers, wherein the ceramic body has a first outer surface and an opposing second outer surface. A plurality of first internal electrodes is disposed on the dielectric layers within the ceramic body and including first lead portions exposed to the exterior of the ceramic body. A plurality of second internal electrodes is disposed in the ceramic body to face the first internal electrodes and including second lead portions exposed to the exterior of the ceramic body. A first electrode layer is disposed on the first outer surface of the ceramic body electrically connected to the first lead portions and having a surface including protruding portions and recessed portions. A second electrode layer is disposed on the second outer surface of the ceramic body to be electrically connected to the second lead portions and having a surface including protruding portions and recessed portions.

The protruding portions and the recessed portions of the surface of the first electrode layer may include crests and troughs, and when a distance between the first lead portions is defined as a and a height of the crests of the first electrode layer is defined as b, $0.5 \leq b/a \leq 3$ may be satisfied.

The protruding portions and the recessed portions of the surface of the second electrode layer may include crests and troughs, and when a distance between the second lead portions is defined as a' and a height of the crests of the second electrode layer is defined as b', $0.5 \leq b'/a' \leq 3$ may be satisfied.

The protruding portions and the recessed portions of the surfaces of the first electrode layer and the second electrode layer may include crests and troughs, the crests of the first electrode layer corresponding to the first lead portions, and the crests of the second electrode layer corresponding to the second lead portions.

The protruding portions and the recessed portions of the surface of the first electrode layer may include crests and troughs, and a height of the crests of the first electrode layer may be 0.5 to 3 μm.

The protruding portions and the recessed portions of the surface of the first electrode layer may include crests and troughs, and when a distance between the first lead portions is defined as a and a difference in heights of the crests and the troughs of the first electrode layer is defined as c, $0.05 \leq c/a \leq 2.8$ may be satisfied.

The protruding portions and the recessed portions of the surface of the first electrode layer may include crests and troughs, and when a height of the crests of the first electrode layer is defined as b and a difference in heights of the crests and the troughs of the first electrode layer is defined as c, $0.1 \leq c/b$ may be satisfied.

The multilayer ceramic electronic component may further include conductive resin layers disposed on the first and second electrode layers.

According to an exemplary embodiment in the present disclosure, a board having a multilayer ceramic electronic component mounted thereon includes a printed circuit board having first and second electrode pads disposed thereon, and the multilayer ceramic electronic component mounted on the printed circuit board. The multilayer ceramic electronic component includes a ceramic body including dielectric layers, and a plurality of internal electrodes disposed in the ceramic body and having exposed portions exposed to the exterior of the ceramic body. An electrode layer is disposed on an outer surface of the ceramic body electrically connected to the exposed portions of the internal electrodes. The electrode layer has an uneven surface.

According to another exemplary embodiment of the disclosure a multilayer ceramic electronic component is provided comprising a ceramic body including a plurality of dielectric layers and a plurality of internal electrodes. The internal electrodes are stacked in a stacking direction and have exposed portions exposed to an exterior of the ceramic body. Each of the internal electrodes is bounded by one of the dielectric layers at each opposing surface of the internal electrodes in the stacking direction. An electrode layer is disposed on an outer surface of the ceramic body electrically connected to the exposed portions of the internal electrodes, and a conductive resin layer disposed on the electrode layers. The electrode layers are wave-shaped, and wave crests correspond to the exposed portions of the internal electrodes and wave troughs correspond to the dielectric layers between the internal electrodes.

In certain embodiments of the multilayer ceramic electronic component, the plurality of internal electrodes may comprise first internal electrodes and second internal electrodes, wherein the first and second internal electrodes are alternately stacked in the stacking direction, and the first internal electrodes have exposed portions exposed to the exterior of the ceramic body on a first outer surface of the ceramic body, and the second internal electrodes have exposed portions exposed to the exterior of the ceramic body on a second outer surface of the ceramic body opposing the first outer surface of the ceramic body.

In certain embodiments of the multilayer ceramic electronic component, a distance between the exposed portions of the internal electrodes is defined as a and a height of the crests of the electrode layer is defined as b, and the relationship $0.5 \leq b/a \leq 3$ may be satisfied.

In certain embodiments of the multilayer ceramic electronic component, a distance between the exposed portions of the internal electrodes is defined as a and a difference in heights of the crests and the troughs is defined as c, and the relationship $0.05 \leq c/a \leq 2.8$ may be satisfied.

In certain embodiments of the multilayer ceramic electronic component, a height of the wave crests of the electrode layer is defined as b and a difference in heights of the wave crests and the wave troughs is defined as c, and the relationship $0.1 \leq c/b$ may be satisfied.

In certain embodiments of the multilayer ceramic electronic component, the height of the wave crests from the outer surface of the ceramic body may be 0.5 to 3 µm.

BRIEF DESCRIPTION OF DRAWINGS

The above and other aspects, features and other advantages of the present disclosure will be more clearly understood from the following detailed description taken in conjunction with the accompanying drawings.

DETAILED DESCRIPTION

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Hereinafter, a multilayer ceramic electronic component will be provided as a multilayer ceramic capacitor, by way of example, but the present disclosure is not limited thereto.

Figure 1:
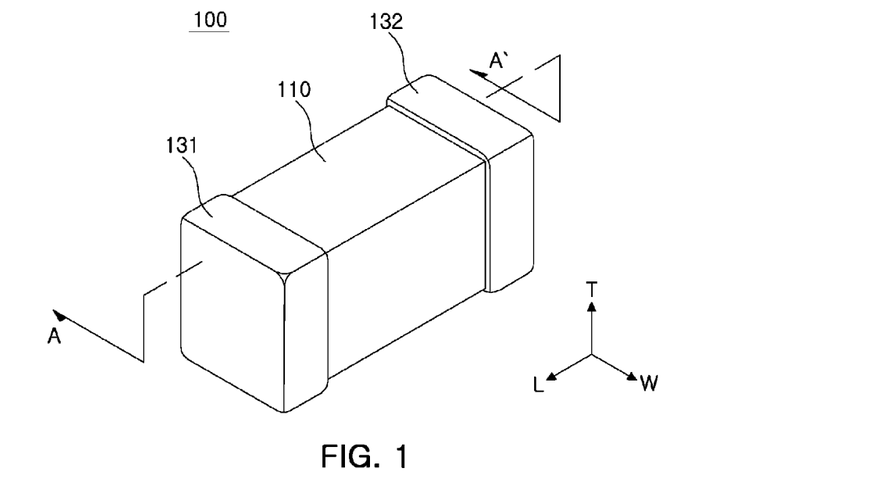
FIG. 1 is a perspective view showing a multilayer ceramic electronic component according to an exemplary embodiment in the present disclosure.
Figure 2:
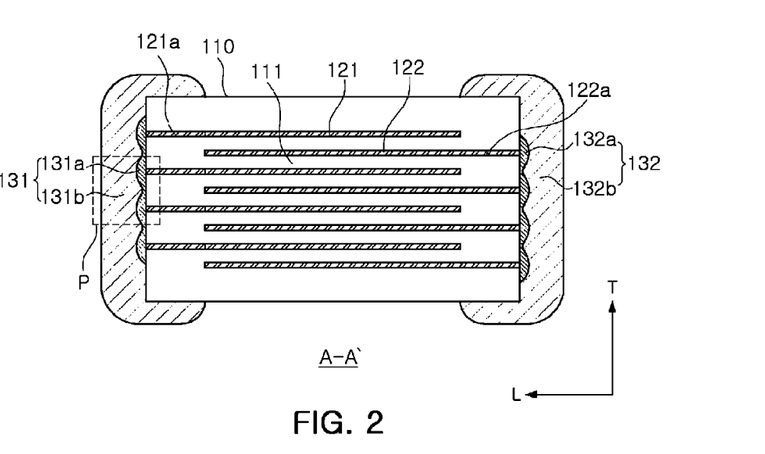
FIG. 2 is a cross-sectional view taken along line A-A' of FIG. 1.

FIG. 1 is a perspective view showing a multilayer ceramic electronic component 100 according to an exemplary embodiment of the present disclosure, and FIG. 2 is a cross-sectional view taken along line A-A' of FIG. 1.

Referring to FIG. 1, the multilayer ceramic electronic component 100 according to an exemplary embodiment in the present disclosure may be a multilayer ceramic capacitor and include a ceramic body 110 and external electrodes 131 and 132.

Referring to FIG. 2, the ceramic body 110 may include an active layer as a part contributing to capacitance formation of the capacitor and upper and lower cover layers formed on upper and lower portions of the active layer as upper and lower margin parts. The active layer may include dielectric layers 111 and internal electrodes 121 and 122, and a plurality of the first and second internal electrodes 121 and 122 may be alternately formed, having the dielectric layers 111 interposed therebetween.

In an exemplary embodiment of the present disclosure, a shape of the ceramic body 110 is not particularly limited, but may be a substantially hexahedral shape. A difference in a thickness may be generated due to the sintering shrinkage of a ceramic powder at the time of sintering a chip and the presence or absence of an internal electrode pattern, and edge portions of the ceramic body may be polished, such that the ceramic body 110 does not have a perfect hexahedral shape but may have a substantially hexahedral shape.

Directions of a hexahedron will be defined in order to clearly describe the exemplary embodiments of the present disclosure. L, W, and T shown in the accompanying drawings refer to a length direction, a width direction, and a thickness direction of the hexahedron, respectively. Here, the thickness direction may be used to have the same concept as a lamination direction in which the dielectric layers are stacked.

The internal electrodes may be configured to include the first and second internal electrodes 121 and 122, and the first and second internal electrodes 121 and 122 may be disposed to face each other, having the dielectric layers 111 interposed therebetween. The first and second internal electrodes 121 and 122, a pair of electrodes having different polarities, may be formed by printing a conductive paste containing a conductive metal on the respective dielectric layers 111 at a predetermined thickness to be alternately exposed to both end surfaces of the ceramic body 110 in the lamination direction in which the dielectric layers 111 are stacked, and may be electrically insulated from each other by the dielectric layers 111 disposed therebetween.

The first and second internal electrodes 121 and 122 may be electrically connected to the external electrodes through exposed portions thereof alternately exposed to the both end surfaces of the ceramic body 110. The external electrodes may include a first external electrode 131 and a second external electrode 132, the first internal electrodes 121 may be electrically connected to the first external electrode 131, and the second internal electrodes 122 may be electrically connected to the second external electrode 132.

The first and second internal electrodes 121 and 122 may be divided into a main portion 121, 122 and a lead portion 121a, 122a. For convenience of understanding, a boundary portion between the main portion and the lead portion is indicated by a dotted line in FIG. 2. The 'main portion' of the internal electrodes, a portion in which the first and second internal electrodes opposing each other are overlapped with one another in the lamination direction, may contribute to capacitance formation, and the 'lead portion' of the internal electrodes may be extended from the main portion and may be connected to the external electrodes.

According to an exemplary embodiment in the present disclosure, the first internal electrodes 121 may include first lead portions 121a exposed to one end surface of the ceramic body 110 and connected to the first external electrode 131.

Further, the second internal electrodes 122 may include second lead portions 122a exposed to the other end surface opposing the one end surface of the ceramic body 110 to which the first lead portions are exposed, and connected to the second external electrode 132.

Therefore, when a voltage is applied to the first and second external electrodes 131 and 132, electrical charges are accumulated between the first and second internal electrodes 121 and 122 opposing each other. In this case, capacitance of the multilayer ceramic capacitor 100 may be in proportion to an area of an overlapped region between the first and second internal electrodes 121 and 122.

A thickness of the first and second internal electrodes 121 and 122 as described above may be determined depending on the usage thereof. For example, the thickness may be determined to be in a range of 0.2 to 1.0 μm in consideration of a size and capacitance of the ceramic body 110, but the present disclosure is not limited thereto.

Further, the conductive metal contained in the first and second internal electrodes 121 and 122 may be nickel (Ni), copper (Cu), palladium (Pd), or an alloy thereof, but the present disclosure is not limited thereto.

In this case, a thickness of the dielectric layers 111 may be optionally changed according to a capacitance design of the multilayer ceramic capacitor. A thickness of a single dielectric layer may be 0.1 to 10 μm after the sintering thereof in consideration of the size and capacitance of the ceramic body 110, but the present disclosure is not limited thereto.

Further, the dielectric layers 111 may contain a ceramic powder having high permittivity, for example, a barium titanate ($BaTiO_3$) based powder or a strontium titanate ($SrTiO_3$) based powder, or the like, but the present disclosure is not limited thereto.

The upper and lower cover layers may have the same material and configuration as those of the dielectric layers 111 except that internal electrodes are not included therein. The upper and lower cover layers may be formed by stacking a single dielectric layer or two or more dielectric layers on upper and lower surfaces of the active layer in a vertical direction, respectively, and may generally serve to prevent the first and second internal electrodes 121 and 122 from being damaged by physical or chemical stress.

The first and second external electrodes 131 and 132 may include electrode layers 131a and 132a and conductive resin layers 131b and 132b formed on the electrode layers.

For example, the first external electrode 131 may include the first electrode layer 131a and the first conductive resin layer 131b formed on the first electrode layer, and the second external electrode 132 may include the second electrode layer 132a and the second conductive resin layer 132b formed on the second electrode layer 132a.

The electrode layers 131a and 132a may be directly connected to the internal electrodes 121 and 122 to secure electrical connection between the external electrodes and the internal electrodes.

The electrode layers 131a and 132a may be formed of a conductive metal, and the conductive metal may be nickel (Ni), copper (Cu), palladium (Pd), gold (Au), silver (Ag), or an alloy thereof, but the present disclosure is not limited thereto.

The electrode layers 131a and 132a may be formed of only the conductive metal without a glass ingredient.

Generally, an external electrode directly connected to an internal electrode of a multilayer ceramic electronic component may be formed by applying an external electrode paste containing a conductive metal powder, a resin, an organic solvent, and glass and then sintering the paste.

Glass contained in the external electrode paste may be softened during a sintering process of the external electrode paste to be fused between the external electrodes and the ceramic body, thereby serving to securely couple the external electrodes to the ceramic body. However, in a case in which glass particles do not sufficiently move during the sintering process, such that glass particles do not exist between the external electrodes and the ceramic body, a coupling strength of a predetermined level or more may not be implemented. Further, in a case in which glass particles do not fill voids between conductive powder particles during the sintering process or heat is applied to the glass particles to thereby form bubbles, a plating solution may infiltrate into the voids, such that reliability of an electronic component may be deteriorated.

However, according to an exemplary embodiment of the present disclosure, the electrode layers 131a and 132b contain only the conductive metal without glass, such that the above-mentioned defects due to the presence of glass may be solved, and a hermetic sealing effect in which the internal electrode is completely sealed from the outside may be effectively implemented. Therefore, deterioration in reliability due to infiltration of the plating solution to be generated during a plating process may be prevented, and moisture resistance properties may be improved.

Further, connectivity between the internal electrode and the external electrode may be improved, such that a defect such as non-uniform capacitance distribution, that is, capacitance variation may be solved.

In addition, according to an exemplary embodiment of the present disclosure, the electrode layers 131a and 132b do not contain glass and the like, and may be formed of only the conductive metal, such that electrical conductivity may be improved, and equivalent series resistance (ESR) of the multilayer ceramic electronic component may be decreased.

According to an exemplary embodiment of the present disclosure, the electrode layers 131a and 132a may have uneven surfaces. The electrode layers have uneven surfaces, such that specific surface areas of the electrode layers may be increased, thereby solving a delamination phenomenon between the conductive resin layers and the electrode layers at the time of forming the conductive resin layers 131b and 132b on the electrode layers.

For example, the electrode layers 131a and 132a may have uneven surfaces including crests and troughs. The surfaces of the electrode layers 131a and 132a may be uneven. On the surfaces of the electrode layers 131a and 132a, protruding portions may be defined as prominences, and recessed portions may be defined as depressions.

According to an exemplary embodiment of the present disclosure, crests may be points at which the surface of the electrode layer is the highest between two recessed portions, and troughs may be points at which the surface of the electrode layer is the lowest between two protruding portions.

According to an exemplary embodiment of the present disclosure, the electrode layers 131a and 132a may be formed on outer surfaces of the ceramic body 110 to be connected to the internal electrodes 121 and 122 in such a manner that the crests of the surfaces of the electrode layers correspond to the exposed portions of the internal electrodes and the troughs of the surfaces of the electrode layers correspond to points between the exposed portions, to which the internal electrodes are not exposed.

For example, as shown in FIG. 2, the electrode layers may be formed such that the crests of the surface of the first electrode layer 131a correspond to the first lead portions 121a and the crests of the surface of the second electrode layer 132a correspond to the second lead portions 122a. In addition, the troughs of the surface of the first electrode layer 131a may correspond to points between the first lead portions 121a, and the troughs of the surface of the second electrode layer 132a may correspond to points between the second lead portions 122a.

As in the exemplary embodiment, when the electrode layers 131a and 132a have uneven surfaces and the crests of the electrode layers are formed to correspond to the exposed portions of the internal electrodes, because portions of the electrode layers formed on the exposed portions of the internal electrodes may have a relatively large thickness, the internal electrodes 121 and 122 may be further efficiently sealed and protected from the outside, and connectivity between the internal electrodes and the electrode layers may be secured.

According to an exemplary embodiment of the present disclosure, the electrode layers 131a and 132a may be formed on regions corresponding to the active layer, in first and second end surfaces of the ceramic body opposing each other in the length direction.

For example, the first electrode layer 131a may be formed to correspond to an exposed portion of an uppermost internal electrode exposed to the first end surface of the ceramic body, an exposed portion of a lowermost internal electrode exposed to the first end surface of the ceramic body, and points between the exposed portions of the internal electrodes.

In addition, the second electrode layer 132a may be formed to correspond to an exposed portion of an uppermost internal electrode exposed to the second end surface of the ceramic body, an exposed portion of a lowermost internal electrode exposed to the second end surface of the ceramic body, and points between the exposed portions of the internal electrodes.

In an exemplary embodiment of the present disclosure, the first and second electrode layers 131a and 132a may be formed on the first and second end surfaces of the ceramic body, respectively, and may not be formed on first and second main surfaces of the ceramic body, opposing each other in the thickness direction and first and second side surfaces of the ceramic body, opposing each other in the width direction.

As in the exemplary embodiment, when the first and second electrode layers 131a and 132a are formed on the first and second end surfaces, respectively, and do not extend to the first and second main surfaces and the first and second side surfaces, a thickness of the first and second electrode layers decreases, and a thickness of the conductive resin layers 131b and 132b formed on the first and second electrode layers increases by an amount equal to a decrease in the thickness of the first and second electrode layers, such that flexural strength of the multilayer ceramic electronic component may be improved, and the internal electrodes 121 and 122 may be efficiently sealed from the outside.

Figure 3:
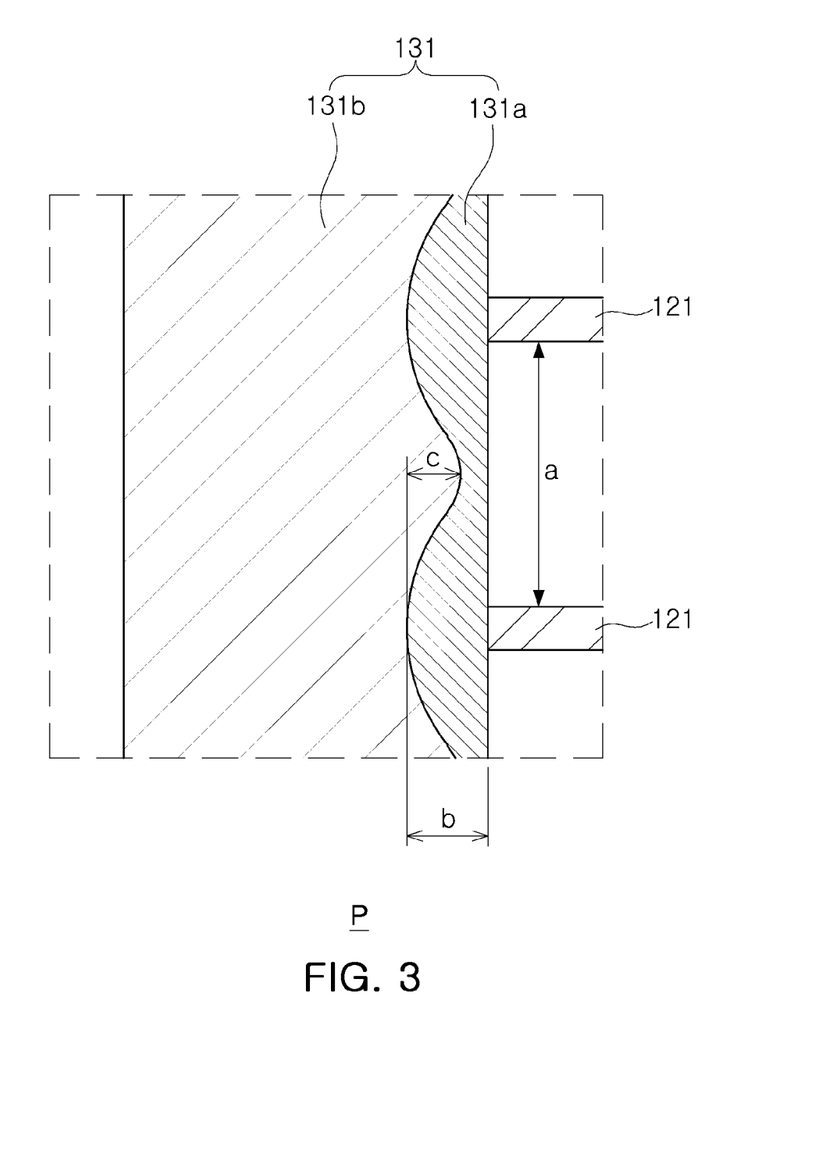
FIG. 3 is an enlarged view of part P of FIG. 2.

FIG. 3 is an enlarged view of part P of FIG. 2.

Part P is a portion of the first external electrode 131 and FIG. 3 is an enlarged view of part P. Configurations of the first and second external electrodes are similar to each other, except that the first external electrode is electrically connected to the first internal electrodes, and the second external electrode is electrically connected to the second internal electrodes. Hereinafter, a description of the external electrodes will be provided based on the first external electrode 131, but it is considered that the description may include a description of the second external electrode 132.

Referring to FIG. 3, according to an exemplary embodiment in the present disclosure, when a height of the crest of the electrode layer is defined as b, and a difference in heights of the crest and the trough is defined as c, $0.1 \leq c/b$ may be satisfied. For example, as shown in FIG. 3, when a height of the crest of the first electrode layer 131a is defined as b, and a difference in heights of the crest and the trough of the first electrode layer 131a is defined as c, c/b may be in a range of 0.1 to 1.0 ($0.1 \leq c/b \leq 1.0$).

In a case in which c/b is less than 0.1, the adhesive force between the electrode layers and the conductive resin layers may not be improved, while in a case in which c/b is 0.1 or more, adhesive force may be improved, such that a delamination phenomenon between the electrode layer and the conductive resin layer may be solved. In addition, since a maximum value of the c/b is 1, c/b may be 1 or less.

More preferably, c/b may be in a range of 0.2 to 0.9 ($0.2 \leq c/b \leq 0.9$).

According to an exemplary embodiment in the present disclosure, when distances between the exposed portions of the internal electrodes are defined as a and differences in heights of the crests and the troughs of the electrode layers 131a and 132b are defined as c, $0.05 \leq c/a \leq 2.8$ may be satisfied.

For example, as shown in FIG. 3, when a distance between the first lead portions 121a is defined as a, and a difference in the heights of the crest and the trough of the first electrode layer 131a is defined as c, 0.05≤c/a≤2.8 may be satisfied.

In a case in which c/a is less than 0.5, a delamination defect between the electrode layers 131a and 132a and the conductive resin layers 131b and 132b may not be improved. When c/a exceeds 2.8, the recessed portion of the uneven surface of the electrode layer (that is, the trough of the uneven surface of the electrode layer) may be significantly recessed, such that a conductive paste for forming the conductive resin layer may not be filled in the recessed portion or the trough of the electrode layer at the time of applying the conductive paste to the electrode layer. When the conductive paste is not filled in the trough of the electrode layer, the delamination defect may be generated due to a decrease in an adhesive surface area between the electrode layers 131a and 132a and the conductive resin layers 131b and 132b, and equivalent series resistance (ESR) may be increased due to the shortening of a current flow path.

According to an exemplary embodiment in the present disclosure, when the distances between the exposed portions of the internal electrodes 121 and 122 are defined as a, and the heights of the crests of the electrode layers 131a and 132a are defined as b, 0.5≤b/a≤3 may be satisfied.

For example, as shown in FIG. 3, when the distance between the first lead portions is defined as a and the height of the crest of the first electrode layer 131a is defined as b, 0.5≤b/a≤3 may be satisfied.

When b/a is less than 0.5, the thickness of the electrode layer may be thin as compared to the distance between the exposed portions of the internal electrode, such that the electrode layers may be formed in a concave-convex shape in which the electrode layers are not connected to each other and cut on the exposed portions of the plurality of internal electrodes at the time of forming the electrode layer. That is, there is a region at which the electrode layer is formed on the exposed portion of the internal electrode but is not formed between the exposed portions of the electrode layer, such that connectivity of the electrode layer may decrease. In the case in which the electrode layer is cut as describe above and thus, connectivity is not secured, ESR may be increased due to the decreased current flow path.

Further, in the case in which b/a is more than 3, it may be difficult to form the electrode layer so as to have the uneven surface, and when the electrode does not have the uneven surface, the adhesive force between the electrode layer and the conductive resin layer formed on the electrode layer is not improved, such that the delamination phenomenon may be generated.

According to an exemplary embodiment in the present disclosure, the height of the crests of the electrode layers 131a and 132a may be 0.5 to 3 μm. For example, as shown in FIG. 3, the height b of the crest of the first electrode layer may be 0.5 to 3 μm.

In a case in which the height of the crests of the electrode layers 131a and 132a is less than 0.5 μm, a contact failure between the internal electrodes 121 and 122 and the electrode layers may be generated. Further, when a thickness of an electrode layer is less than 0.5 μm in a chip having a defect such as a depression of an internal electrode from a surface of a ceramic body, the depression of the internal electrode may not be overcome, such that electrode connection between the internal electrode and an external electrode may be defective, and the implementation of capacitance may not be facilitated.

Furthermore, in a case in which the height of the crests of the electrode layers 131a and 132a is greater than 3 μm, the ceramic body may be damaged during a formation process of the electrode layers, such that high temperature acceleration lifespan and moisture resistance properties may be deteriorated.

The electrode layers 131a and 132a may be formed by a plating or deposition method (e.g. —sputtering) of a conductive metal according to an exemplary embodiment of the present disclosure, but is not limited thereto.

According to an exemplary embodiment in the present disclosure, the external electrodes may include the conductive resin layers 131b and 132b formed on the electrode layers 131a and 132a, respectively. The conductive resin layers 131b and 132b may include the first conductive resin layer 131b formed on the first electrode layer 131a and the second conductive resin layer 132b formed on the second electrode layer 132a.

According to an exemplary embodiment of the present disclosure, the conductive resin layers 131b and 132b may physically contact the first and second electrode layers 131a and 132a. In other words, additional configurations may not be provided between the first and second electrode layers and the conductive resin layers, and the conductive resin layers may be directly formed on the first and second electrode layers.

According to an exemplary embodiment in the present disclosure, the conductive resin layers 131b and 132b may contain a plurality of conductive particles and a base resin, and the base resin may include a thermosetting resin. The thermosetting resin may be an epoxy resin, but is not limited thereto.

The conductive particles may contain at least one of copper, silver, nickel, and an alloy thereof and contain a copper material coated with silver.

Figure 4:
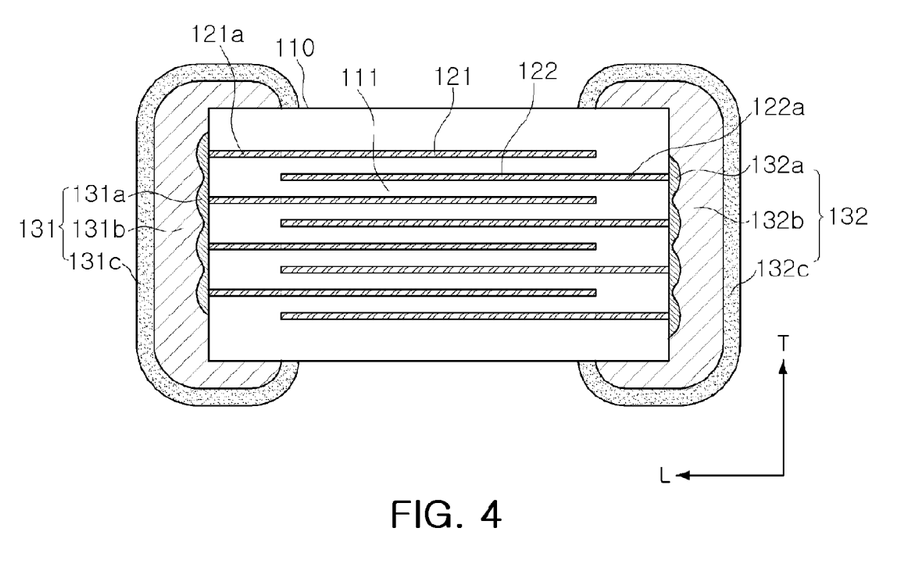
FIG. 4 is a cross-sectional view of the multilayer ceramic electronic component according to the exemplary embodiment in the present disclosure.

FIG. 4 is a cross-sectional view of the multilayer ceramic electronic component according to the exemplary embodiment of the present disclosure in a length-thickness (L-T) direction.

According to an exemplary embodiment in the present disclosure, as shown in FIG. 4, the first and second external electrodes 131 and 132 may further include plating layers 131c and 132c formed on the conductive resin layers 131b and 132b, respectively.

The plating layer may improve adhesion properties between the external electrode and a soldering part at the time of mounting the multilayer ceramic electronic component on a board.

For example, the first external electrode 131 may include the first electrode layer 131a, the first conductive resin layer 131b formed on the first electrode layer 131a, and the first plating layer 131c formed on the first conductive resin layer 132b, and the second external electrode 132 may include the second electrode layer 132a, the second conductive resin layer 132b formed on the second electrode layer 132a, and the second plating layer 132c formed on the second conductive resin layer 132b.

The first and second plating layers may contain nickel (Ni) or tin (Sn), but are not limited thereto. In addition, the respective first and second plating layers may be formed of two layers or more. For example, each of the first and second plating layers may include a nickel plating layer formed on the conductive resin layer containing nickel, and a tin plating layer formed on a nickel plating layer containing tin.

Hereinafter, a manufacturing method of the multilayer ceramic electronic component according to the exemplary embodiment of the present disclosure will be described, but is not limited thereto.

In addition, in descriptions of the manufacturing method of the multilayer ceramic capacitor according to the exemplary embodiment, a description overlapped with that of the above-mentioned multilayer ceramic capacitor will be omitted.

In the manufacturing method of the multilayer ceramic capacitor according to the exemplary embodiment of the present disclosure, first, a slurry containing a powder such as a barium titanate ($BaTiO_3$) powder, or the like, may be applied to carrier films and dried thereon to prepare a plurality of ceramic green sheets, thereby forming dielectric layers and cover layers.

The ceramic green sheets may be manufactured by mixing the ceramic powder, a binder, and a solvent to prepare the slurry and manufacturing the prepared slurry in sheet shapes each having a thickness of several μm by a doctor blade method.

Next, a conductive paste for an internal electrode containing a nickel powder may be prepared.

After the conductive paste for the internal electrode is applied onto the green sheets by a screen printing method to form internal electrodes, a plurality of green sheets on which the internal electrodes are printed may be stacked and a plurality of green sheets on which the internal electrodes are not printed may be stacked on upper and lower surfaces of the multilayer body, and the multilayer body is sintered, thereby manufacturing the ceramic body 110. The ceramic body may include the internal electrodes 121 and 122, the dielectric layers 111, and the cover layers, wherein the dielectric layers may be formed by sintering the green sheets on which the internal electrodes are printed, and the cover layers may be formed by sintering the green sheets on which the internal electrodes are not printed.

The internal electrodes may be formed of the first and second internal electrodes.

The first and second electrode layers 131a and 132a may be formed on outer surfaces of the ceramic body electrically connected to the first and second internal electrodes, respectively.

The first and second electrode layers may be formed by a plating or deposition method (e.g. —sputtering) of a conductive metal.

When the first and second electrode layers are formed by applying and sintering the paste for an external electrode, a crack may be generated in the ceramic body by diffusion between the internal electrode and the paste for an external electrode, expansion of the internal electrode, and the like. On the other hand, the first and second electrode layers are formed by a plating or deposition method (e.g. —sputtering) of a conductive metal as described above, an external electrode having target capacitance without damage to the ceramic body may be formed.

When the first and second electrode layers 131a and 132a are formed by plating the conductive metal, a shape of the surface of the electrode layer may be controlled by adjusting a plating time and an amount of current applied at the time of plating. Further, when the first and second electrode layers 131a and 132a are formed by a sputtering method, shapes of the first and second electrode layers may be controlled by adjusting applied power, temperature, operational pressure, or the like.

The conductive metal is not particularly limited, but may be, for example, at least one selected from a group consisting of copper (Cu), silver (Ag), nickel (Ni), gold (Au), palladium (Pd), and an alloy thereof.

Next, a conductive resin composition containing a plurality of conductive particles and a base resin may be applied to the first and second electrode layers 131a and 132a and hardening the composition, thereby forming the conductive resin layers 131b and 132b.

The conductive particles may contain at least one of copper, silver, nickel, palladium, gold, an alloy thereof, and a copper material coated with silver, but is not limited thereto.

The base resin may include a thermosetting resin, for example, an epoxy resin.

According to an exemplary embodiment in the present disclosure, the manufacturing method may further include, after the forming of the conductive resin layers, forming the plating layers 131c and 132c on the conductive resin layers.

Board Having a Multilayer Ceramic Electronic Component Mounted Thereon

Figure 5:
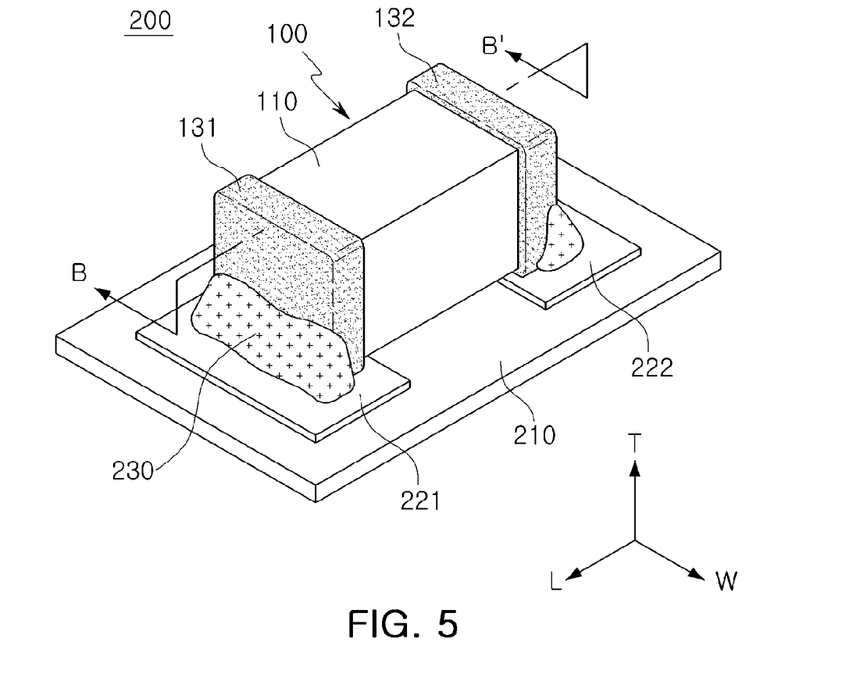
FIG. 5 is a perspective view showing a state in which the multilayer ceramic electronic component according to the exemplary embodiment in the present disclosure is mounted on a printed circuit board.
Figure 6:
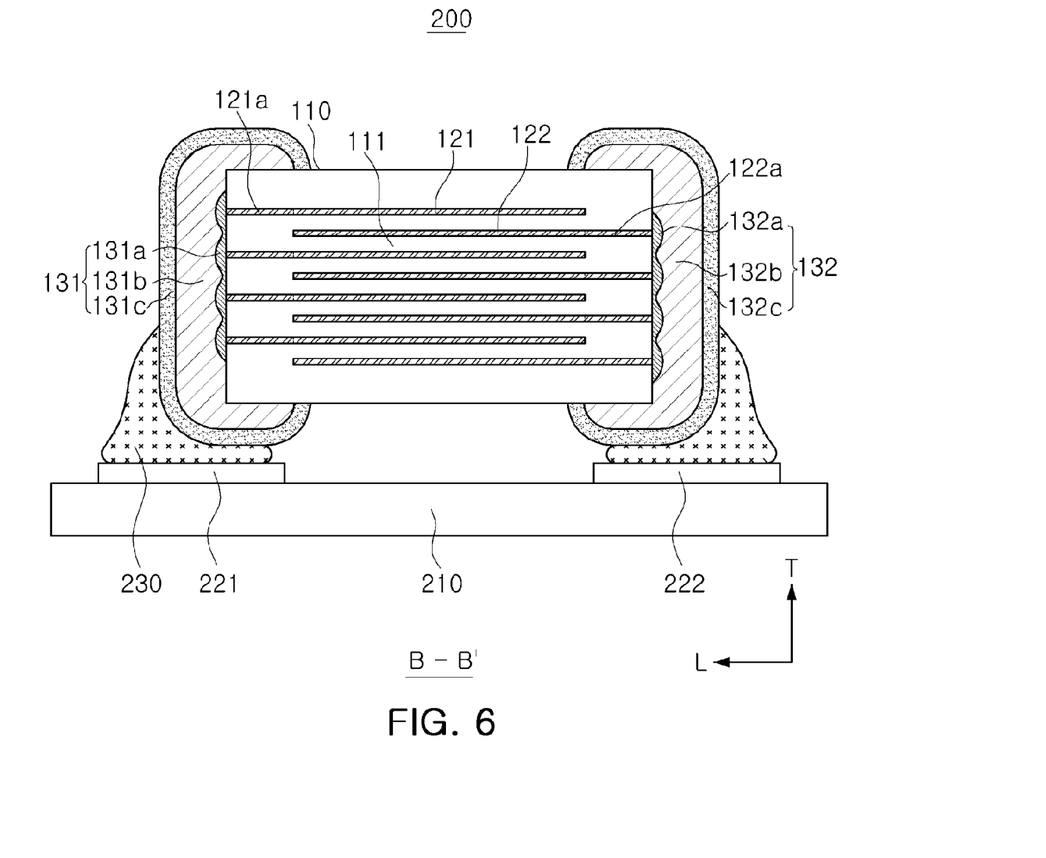
FIG. 6 is a cross-sectional view taken along line B-B' of FIG. 5.

FIG. 5 is a perspective view showing a state in which the multilayer ceramic electronic component according to the exemplary embodiment of the present disclosure is mounted on a printed circuit board, and FIG. 6 is a cross-sectional view taken along line B-B' of FIG. 5.

Referring to FIGS. 5 and 6, a board 200 having the multilayer ceramic electronic component mounted thereon according to the exemplary embodiment of the present disclosure may include a printed circuit board 210 having first and second electrode pads 221 and 222 formed thereon spaced apart from each other and the multilayer ceramic electronic component mounted on the printed circuit board connected to the first and second electrode pads 221 and 222.

In this case, the multilayer ceramic electronic component may be electrically connected to the printed circuit board 210 by soldering parts 230 in a state in which the first and second external electrodes 131 and 132 are positioned on the first and second electrode pads 221 and 222, respectively, to contact each other.

According to an exemplary embodiment in the present disclosure, the board having the multilayer ceramic electronic component mounted thereon may include the printed circuit board 210 having the first and second electrode pads formed thereon; and the multilayer ceramic electronic component 100 mounted on the printed circuit board. The multilayer ceramic electronic component includes a ceramic body including dielectric layers, a plurality of internal electrodes formed in the ceramic body and having exposed portions exposed to the exterior of the ceramic body, and electrode layers formed on outer surfaces of the ceramic body electrically connected to the exposed portions of the internal electrodes. The electrode layers have uneven surfaces.

According to an exemplary embodiment in the present disclosure, the multilayer ceramic electronic component may further include conductive resin layers formed on the electrode layers.

According to an exemplary embodiment in the present disclosure, the multilayer ceramic electronic component may further include conductive resin layers formed on the electrode layers and plating layers formed on the conductive resin layers.

A description of the board having the multilayer ceramic electronic component mounted thereon, overlapped with that of the above-mentioned multilayer ceramic electronic component will be omitted.

Experimental Example

Multilayer ceramic capacitors according to the Experimental Example were manufactured as follows.

First, a slurry containing a powder such as a barium titanate ($BaTiO_3$) or the like, having an average particle size of 0.1 μm was applied to carrier films and dried thereon to prepare a plurality of ceramic green sheets having thicknesses of 0.85 μm, 0.95 μm, 1.05 μm, and 1.25 μm, thereby forming dielectric layers.

Next, a conductive paste for an internal electrode in which an average particle size of a nickel powder was 0.1 to 0.2 μm and the nickel powder was included in an amount of 40 to 50 parts by weight was prepared.

The conductive paste for an internal electrode was applied to the green sheets by a screen printing method to thereby form internal electrodes. Then, 100 green sheets or more were stacked, such that a plurality of multilayer bodies were formed.

Thereafter, the multilayer bodies were compressed, cut, and sintered at a temperature of 1050 to 1200° C. under a reducing atmosphere in which $H_2$ is included in an amount of 0.1% or less, thereby forming ceramic bodies.

Next, electrode layers having uneven surfaces were formed on the ceramic bodies by a plating method in such a manner that thicknesses and shapes thereof are different according to conditions shown in Table 1 to 3, and then conductive resin layers were formed on the electrode layers. Then, properties of the multilayer ceramic capacitors were then evaluated.

The following Table 1 shows contact failure rates, high temperature acceleration lifespan failure rates, and moisture resistance reliability failure rates depending on a height of crests measured in the uneven surfaces of the electrode layers (hereinafter, referred to as heights of the crests of the electrode layers).

In Table 1, a contact failure was determined when the actual capacitance decreased by 20% or more as compared to designed capacitance. Thus, it was determined the connectivity between the internal electrode and the external electrode was not secure. The high temperature acceleration lifespan failure rate was determined by applying a voltage having a level twice that of a rated voltage to the multilayer ceramic electronic component at 150° C. for 12 hours. When the insulation resistance (IR) degradation was generated, (such as when an IR value rapidly decreased as compared to an initial value thereof. For example, when the IR value decreased to be equal to or less than 1/10 of the initial value thereof, or if the multilayer ceramic electronic component was operable), it was deemed a high temperature acceleration lifespan failure. The moisture resistance reliability was determined by applying a voltage having a level twice that of a rated voltage to the multilayer ceramic electronic component under conditions of 85° C. and humidity of 85% for 12 hours. When IR degradation was generated (a case in which the IR value was rapidly decreased as compared to the initial value thereof. For example, when the IR value decreased to be equal to or less than 1/10 of the initial value, or a case in which the multilayer ceramic electronic component was not operable).

TABLE 1

| Sample | Height of Crests of Electrode Layer | Contact Failure Rate | High Temperature Acceleration Lifespan Failure Rate | Moisture Resistance Reliability Failure Rate |
|---|---|---|---|---|
| 1 | 0.3 μm | 5% | 0% | 0% |
| 2 | 0.5 μm | 0% | 0% | 0% |
| 3 | 0.7 μm | 0% | 0% | 0% |
| 4 | 1.0 μm | 0% | 0% | 0% |
| 5 | 2.0 μm | 0% | 0% | 0% |
| 6 | 3.0 μm | 0% | 0% | 0% |
| 7 | 4.0 μm | 0% | 5% | 20% |
| 8 | 5.0 μm | 0% | 5% | 20% |
| 9 | 10.0 μm | 0% | 15% | 20% |

As shown in Table 1, it could be confirmed that when the height of the crests of the electrode layer was less than 0.5 μm, contact failure was generated, and when the height of the crests of the electrode layer was greater than 3 μm, the high temperature acceleration life span failure rate and the moisture resistance reliability failure rate increased.

The following Table 2 shows data obtained by observing whether or not an electrode layer having a continuous uneven shape was easily implemented, whether or not ESR was increased, and whether or not delamination defects were generated between the electrode layer and the conductive resin layer formed on the electrode layer, depending on b/a when a distance between the exposed portions of the internal electrodes was defined as a and a height of the crests of the electrode layer was defined as b.

TABLE 2

| Sample | b/a | Whether or Not Continuous uneven Shape Was Implemented | Whether or Not ESR Was Increased | Delamination Defect |
|---|---|---|---|---|
| 10 | 0.3 | X | X | ○ |
| 11 | 0.5 | ○ | ○ | ○ |
| 12 | 1.0 | ○ | ○ | ○ |
| 13 | 2.0 | ○ | ○ | ○ |
| 14 | 3.0 | ○ | ○ | ○ |
| 15 | 3.5 | X | ○ | X |
| 16 | 4.0 | X | ○ | X |

○: Easy Implementation of Continuous Uneven Shape, No increase in ESR, and No occurrence of delamination defect.
X: Difficult Implementation of Continuous Uneven Shape, Increase in ESR, and Occurrence of delamination defect.

As shown in Table 2, when b/a was less than 0.5, the electrode layer was formed on regions corresponding to the exposed portions of the internal electrodes and was not formed on regions between the exposed portions, such that connectivity of the electrode layer was not secured. On the other hand, when b/a was in a range of 0.5 to 3, the electrode layer having a continuous uneven surface was formed, such that the electrode layer in which ESR did not increase and the delamination defect with the conductive resin layer was not generated.

Further, it could be confirmed that when b/a was greater than 3, the formation of the electrode layer having the uneven surface was not facilitated, such that the delamination defect was generated between the conductive resin layer and the electrode layer.

The following Table 3 shows data obtained by observing the occurrence of the delamination defects between the electrode layer and the conductive resin layer formed on the electrode layer, depending on c/a when the distance between the exposed portions of the internal electrodes was defined as a, and a difference in heights of the crest and the trough of the electrode layer having the uneven surface was defined as c. In other words, c was a height difference between the high point of the surface of the first electrode layer and a low point of the surface of the first electrode layer.

TABLE 3

| Sample | c/a  | Delamination Defect |
|--------|------|---------------------|
| 17     | 0.01 | NG                  |
| 18     | 0.03 | NG                  |
| 19     | 0.05 | OK                  |
| 20     | 0.1  | OK                  |
| 21     | 0.2  | OK                  |
| 22     | 0.5  | OK                  |
| 23     | 1.0  | OK                  |
| 24     | 2.0  | OK                  |
| 25     | 2.5  | OK                  |
| 26     | 2.8  | OK                  |
| 27     | 3.0  | NG                  |
| 28     | 4.0  | NG                  |

OK: No occurrence of the Delamination Defect
NG: Occurrence of the Delamination Defect As shown in Table 3, when c/a was less than 0.05, the delamination defect did not decrease, and when c/a was greater than 2.8, the conductive paste was not applied onto the entire surface of the electrode layer, such that an adhesive surface area between the electrode layer and the conductive resin layer decreased, thereby generating the delamination defect.

The following Table 4 shows data obtained by observing the occurrence of the delamination defect between the electrode layer and the conductive resin layer formed on the electrode layer, depending on c/b when the height of the crest of the electrode layer having the uneven surface was defined as b and the difference in heights of the crest and the trough of the electrode layer having the uneven surface was defined as c. In other words, c was a height difference between a high point of the surface of the first electrode layer and a low point of the surface of the first electrode layer was low).

TABLE 4

| Sample | c/b | Delamination Defect |
|--------|-----|---------------------|
| 29     | 0.0 | NG                  |
| 30     | 0.1 | OK                  |
| 31     | 0.2 | OK                  |
| 32     | 0.3 | OK                  |
| 33     | 0.5 | OK                  |
| 34     | 0.7 | OK                  |
| 35     | 0.9 | OK                  |

As shown in Table 4, it could be confirmed that in a case in which c/b was less than 0.1, the delamination defect was not improved.

As set forth above, according to exemplary embodiments of the present disclosure, a multilayer ceramic electronic component capable of efficiently protecting internal electrodes from external stimulation and having uniform capacitance distribution may be provided.

In addition, a multilayer ceramic capacitor in which a thickness and a shape of an external electrode are easily controllable may be provided.

According to exemplary embodiments in the present disclosure, a multilayer ceramic electronic component capable of decreasing a delamination defect at the time of forming a conductive resin layer on an electrode layer and improving flexural strength may be provided.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic component comprising:
a ceramic body including dielectric layers;
a plurality of internal electrodes disposed in the ceramic body and having exposed portions exposed to the exterior of the ceramic body;
an electrode layer disposed on an outer surface of the ceramic body electrically connected to the exposed portions of the internal electrodes; and
a conductive resin layer disposed on the electrode layer,
wherein the electrode layer has an uneven surface including crests and troughs, and when a distance between the exposed portions of the internal electrodes is defined as a and a height of the crests of the electrode layer is defined as b, $0.5 \leq b/a \leq 3$ is satisfied.

2. The multilayer ceramic electronic component of claim 1, wherein the crests of the electrode layer corresponding to the exposed portions of the internal electrodes, and the troughs of the electrode layer corresponding to points between the exposed portions of the internal electrodes.

3. The multilayer ceramic electronic component of claim 1, wherein a height of the crests of the electrode layer is 0.5 to 3 μm.

4. A multilayer ceramic electronic component comprising:
a ceramic body including a plurality of dielectric layers, wherein the ceramic body has a first outer surface and an opposing second outer surface;
a plurality of first internal electrodes disposed on the dielectric layers in the ceramic body and including first lead portions exposed to the exterior of the ceramic body;
a plurality of second internal electrodes disposed in the ceramic body to face the first internal electrodes and including second lead portions exposed to the exterior of the ceramic body;
a first electrode layer disposed on the first outer surface of the ceramic body electrically connected to the first lead portions and having a surface including protruding portions and recessed portions; and
a second electrode layer disposed on the second outer surface of the ceramic body electrically connected to the second lead portions and having a surface including protruding portions and recessed portions,
wherein the protruding portions and the recessed portions of the surface of the first electrode layer include crests and troughs, and when a distance between the first lead portions is defined as a and a difference in heights of the crests and the troughs of the first electrode layer is defined as c, $0.05 \leq c/a \leq 2.8$ is satisfied.

5. The multilayer ceramic electronic component of claim 4, wherein the protruding portions and the recessed portions of the surface of the first electrode layer include crests and troughs, and when a distance between the first lead portions is defined as a and a height of the crests of the first electrode layer is defined as b, $0.5 \leq b/a \leq 3$ is satisfied.

6. The multilayer ceramic electronic component of claim 4, wherein the protruding portions and the recessed portions of the surface of the second electrode layer include crests and troughs, and when a distance between the second lead portions is defined as a' and a height of the crests of the second electrode layer is defined as b', $0.5 \leq b'/a' \leq 3$ is satisfied.

7. The multilayer ceramic electronic component of claim 4, wherein the protruding portions and the recessed portions of the surfaces of the first electrode layer and the second electrode layer include crests and troughs, the crests of the first electrode layer corresponding to the first lead portions, and the crests of the second electrode layer corresponding to the second lead portions.

8. The multilayer ceramic electronic component of claim 4, wherein the protruding portions and the recessed portions of the surface of the first electrode layer include crests and troughs, and a height of the crests of the first electrode layer is 0.5 to 3 μm.

9. A multilayer ceramic electronic component comprising:
a ceramic body including a plurality of dielectric layers, wherein the ceramic body has a first outer surface and an opposing second outer surface;
a plurality of first internal electrodes disposed on the dielectric layers in the ceramic body and including first lead portions exposed to the exterior of the ceramic body;
a plurality of second internal electrodes disposed in the ceramic body to face the first internal electrodes and including second lead portions exposed to the exterior of the ceramic body;
a first electrode layer disposed on the first outer surface of the ceramic body electrically connected to the first lead portions and having a surface including protruding portions and recessed portions; and
a second electrode layer disposed on the second outer surface of the ceramic body electrically connected to the second lead portions and having a surface including protruding portions and recessed portions,
wherein the protruding portions and the recessed portions of the surface of the first electrode layer include crests and troughs, and when a height of the crests of the first electrode layer is defined as b and a difference in heights of the crests and the troughs of the first electrode layer is defined as c, $0.1 \leq c/b$ is satisfied.

10. The multilayer ceramic electronic component of claim 4, further comprising conductive resin layers disposed on the first and second electrode layers.

11. A board having a multilayer ceramic electronic component mounted thereon, the board comprising:
a printed circuit board having first and second electrode pads disposed thereon; and
the multilayer ceramic electronic component mounted on the printed circuit board,
wherein the multilayer ceramic electronic component includes a ceramic body including dielectric layers;
a plurality of internal electrodes disposed in the ceramic body and having exposed portions exposed to the exterior of the ceramic body; and
an electrode layer disposed on an outer surface of the ceramic body electrically connected to the exposed portions of the internal electrodes, the electrode layer having an uneven surface including crests and troughs, and
wherein the height of the wave crests from the outer surface of the ceramic body is 0.5 to 3 μm.

12. A multilayer ceramic electronic component comprising:
a ceramic body including a plurality of dielectric layers;
a plurality of internal electrodes,
wherein the internal electrodes are stacked in a stacking direction,
the internal electrodes have exposed portions exposed to an exterior of the ceramic body, and
each of the internal electrodes are bounded by one of the dielectric layers at each opposing surface of the internal electrodes in the stacking direction;
an electrode layer disposed on an outer surface of the ceramic body electrically connected to the exposed portions of the internal electrodes; and
a conductive resin layer disposed on the electrode layers,
wherein the electrode layers are wave-shaped, and wave crests correspond to the exposed portions of the internal electrodes and wave troughs correspond to the dielectric layers between the internal electrodes, and
the height of the wave crests from the outer surface of the ceramic body is 0.5 to 3 μm.

13. The multilayer ceramic electronic component of claim 12, wherein the plurality of internal electrodes comprise first internal electrodes and second internal electrodes,
wherein the first and second internal electrodes are alternately stacked in the stacking direction, and
the first internal electrodes have exposed portions exposed to the exterior of the ceramic body on a first outer surface of the ceramic body, and the second internal electrodes have exposed portions exposed to the exterior of the ceramic body on a second outer surface of the ceramic body opposing the first outer surface of the ceramic body.

14. The multilayer ceramic electronic component of claim 12, wherein a distance between the exposed portions of the internal electrodes is defined as a and a height of the crests of the electrode layer is defined as b, and the relationship $0.5 \leq b/a \leq 3$ is satisfied.

15. The multilayer ceramic electronic component of claim 12, wherein a distance between the exposed portions of the internal electrodes is defined as a and a difference in heights of the crests and the troughs is defined as c, and the relationship $0.05 \leq c/a \leq 2.8$ is satisfied.

16. The multilayer ceramic electronic component of claim 12, wherein a height of the wave crests of the electrode layer is defined as b and a difference in heights of the wave crests and the wave troughs is defined as c, and the relationship $0.1 \leq c/b$ is satisfied.

* * * * *

UNITED STATES PATENT AND TRADEMARK OFFICE
CERTIFICATE OF CORRECTION

PATENT NO. : 9,514,884 B2  
APPLICATION NO. : 14/281361  
DATED : December 6, 2016  
INVENTOR(S) : Kyoung No Lee et al.

Page 1 of 1

It is certified that error appears in the above-identified patent and that said Letters Patent is hereby corrected as shown below:

On the Title Page

Please add item (30):  
(30) Foreign Application Priority Data  
Nov. 15, 2013   (KR) ............... 10-2013-0139219

Signed and Sealed this  
Nineteenth Day of June, 2018

Andrei Iancu  
*Director of the United States Patent and Trademark Office*